United States Patent
Van Leeuwen et al.

(10) Patent No.: US 10,338,483 B2
(45) Date of Patent: Jul. 2, 2019

(54) ACTUATOR SYSTEM AND LITHOGRAPHIC APPARATUS

(71) Applicant: ASML NETHERLANDS B.V., Veldhoven (NL)

(72) Inventors: Robbert Edgar Van Leeuwen, Eindhoven (NL); Hans Butler, Best (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/070,848

(22) PCT Filed: Jan. 30, 2017

(86) PCT No.: PCT/EP2017/051877
§ 371 (c)(1),
(2) Date: Jul. 18, 2018

(87) PCT Pub. No.: WO2017/144236
PCT Pub. Date: Aug. 31, 2017

(65) Prior Publication Data
US 2019/0079416 A1 Mar. 14, 2019

(30) Foreign Application Priority Data
Feb. 25, 2016 (EP) .................................... 16157397

(51) Int. Cl.
*G03F 7/20* (2006.01)
*H01L 41/00* (2013.01)
(Continued)

(52) U.S. Cl.
CPC ..... *G03F 7/70758* (2013.01); *G01B 9/02015* (2013.01); *G03F 7/70733* (2013.01);
(Continued)

(58) Field of Classification Search
None
See application file for complete search history.

(56) References Cited

U.S. PATENT DOCUMENTS 3,539,244 A * 11/1970 Marks ..................... G02F 1/29
359/311
3,648,048 A 3/1972 Cahan et al.
(Continued)

FOREIGN PATENT DOCUMENTS

| JP | 2502571 | 5/1996 |
| JP | 2014/123778 | 7/2014 |
| RU | 2013134491 | 1/2015 |

OTHER PUBLICATIONS

International Search Report and Written Opinion issued in corresponding PCT Application No. PCT/EP2017/051877, dated May 16, 2017, 14 pages.
(Continued)

*Primary Examiner* — Michelle M Iacoletti
(74) *Attorney, Agent, or Firm* — Pillsbury Winthrop Shaw Pittman LLP (57) ABSTRACT

An actuator system configured to position an object, the actuator system includes a piezo actuator having an actuator contact surface. The piezo actuator is configured to exert a force via the actuator contact surface onto the object. The piezo actuator includes a transparent piezo material. The actuator system further has an optical position sensor configured to measure a position of the actuator contact surface. The optical position sensor is configured to transmit an optical beam through the transparent piezo material to the actuator contact surface. The optical position sensor may form an interferometer.

20 Claims, 6 Drawing Sheets (51) Int. Cl.
*H01L 41/02* (2006.01)
*H01L 41/04* (2006.01)
*G01B 9/02* (2006.01)

(52) U.S. Cl.
CPC .......... *G03F 7/70775* (2013.01); *H01L 41/00* (2013.01); *H01L 41/02* (2013.01); *H01L 41/04* (2013.01)

(56) References Cited

U.S. PATENT DOCUMENTS

| | | |
|---|---|---|
| 5,233,582 A | 8/1993 | Tanno et al. |
| 2014/0160452 A1 | 6/2014 | De Jager et al. |
| 2016/0154322 A1 | 6/2016 | Huang et al. |

OTHER PUBLICATIONS

Buechner, H.j., et al: "An optical standing-wave interferometer for displacement measurements", Institute of Physics Publishing, Measurement Science and Technology, vol. 14, No. 3, Mar. 1, 2003, 6 pages.

\* cited by examiner

ACTUATOR SYSTEM AND LITHOGRAPHIC APPARATUS

CROSS REFERENCE TO RELATED APPLICATIONS

This application is the U.S. national phase entry of PCT patent application no. PCT/EP2017/051877, which was filed on Jan. 30, 2017, which claims the benefit of priority of European patent application no. 16157397.7, which was filed on Feb. 25, 2016, and which is incorporated herein in its entirety by reference.

FIELD OF THE INVENTION

The present invention relates to an actuator system and a lithographic apparatus comprising such actuator system.

DESCRIPTION OF THE RELATED ART

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, as well as in other applications where an accurate and fast positioning of an object is desired, piezo actuators may be used. A piezo actuator relies on a piezo electric effect, whereby an electrical voltage applied to the piezo electric material of the piezo actuator provides for a deformation of the piezo electric material. The piezo actuator may for example be applied to position an object. Many piezo electric materials are known. Although the piezo electric material exhibits favorable properties, such as being stiff, having a high resolution and providing a fast response, the material may also exhibit some less favorable properties. For example, a relation between the applied voltage and the degree of deformation of the piezo actuator may be inaccurate, for example as a result of hysteresis or other effects. In order to measure a position of the object, a position sensor may be applied. The position sensor may for example be formed by an interferometer or an encoder. On the one hand, this results in complex systems, as a separate position sensor would need to be added for each actuator. On the other hand, deformations of the object, such as resonance modes, may result in positioning errors of the object position, as the actuator exerts a force on one part of the object while the position sensor measures a position at another part of the object, thus each relate to a different part of the object.

SUMMARY

It is desirable to provide an improved piezo electric actuator.

According to an embodiment of the invention, there is provided an actuator system configured to position an object, the actuator system comprising:

a piezo actuator comprising an actuator contact surface, wherein the piezo actuator is configured to exert a force via the actuator contact surface onto the object, and an optical position sensor configured to measure a position of the actuator contact surface, wherein the piezo actuator comprises a transparent piezo electric material, and wherein the optical position sensor is configured to transmit an optical beam through the transparent piezo electric material to the actuator contact surface.

In another embodiment of the invention, there is provided a lithographic projection apparatus comprising the actuator system according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
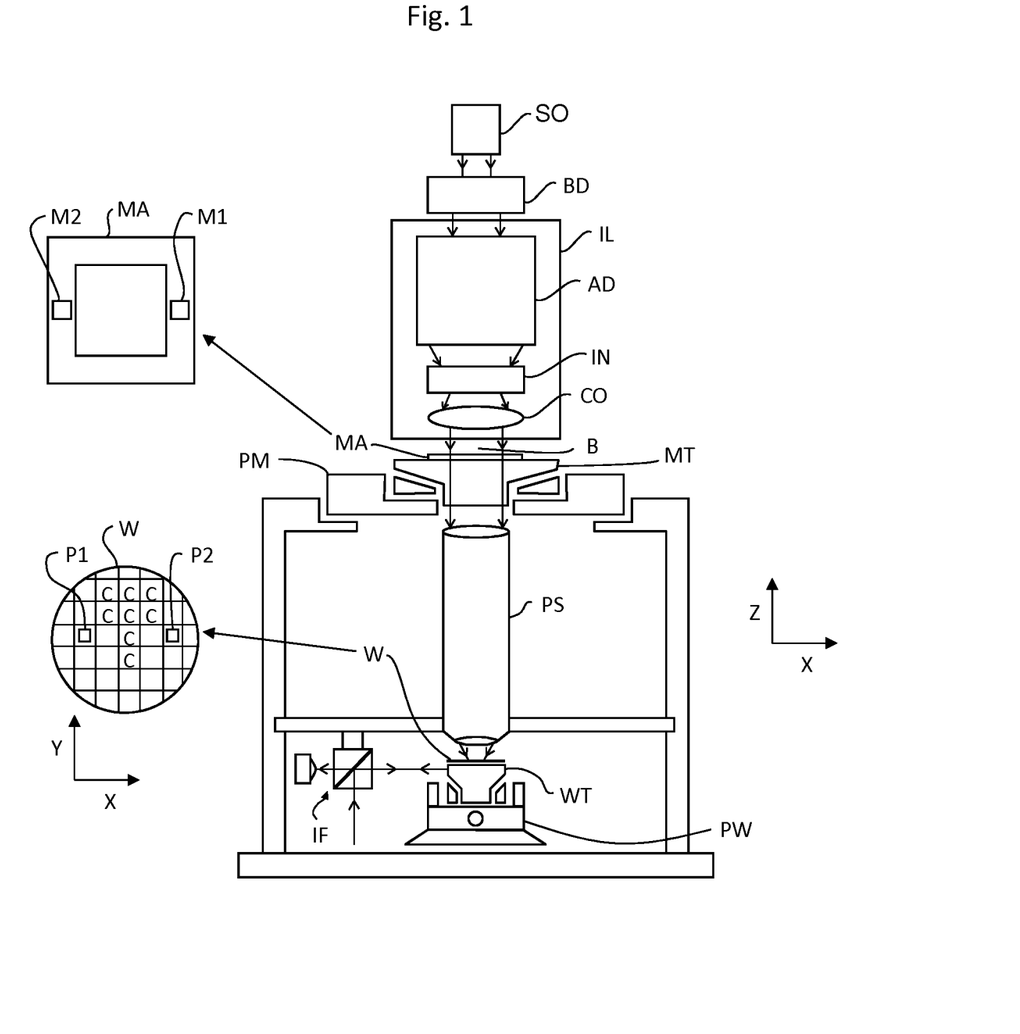
FIG. 1 depicts a lithographic apparatus in which an embodiment of the invention may be provided.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The lithographic apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The mask support structure MT supports, i.e. bears the weight of, the patterning device MA. The mask support structure MT holds the patterning device MA in a manner that depends on the orientation of the patterning device MA, the design of the lithographic apparatus, and other conditions, such as for example whether or not the patterning device MA is held in a vacuum environment. The mask support structure MT can use mechanical, vacuum, electrostatic or other clamping techniques to hold the patterning device MA. The mask support structure MT may be a frame or a table, for example, which may be fixed or movable as required. The mask support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion C of the substrate, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The term "radiation beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illumination system IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam is passed from the radiation source SO to the illumination system IL with the aid of a beam delivery system BD including, for example, suitable directing mirrors and/or a beam expander. In other cases the radiation source SO may be an integral part of the lithographic apparatus, for example when the radiation source SO is a mercury lamp. The radiation source SO and the illumination system IL, together with the beam delivery system BD if required, may be referred to as a radiation system.

The illumination system IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may include various other components, such as an integrator IN and a condenser CO. The illumination system IL may be used to condition the radiation beam, to have a desired uniformity and intensity distribution in its cross-section.

The radiation beam B is incident on the patterning device MA, which is held on the mask support structure MT, and is patterned by the patterning device MA. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the mask support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Such dedicated target portions are known as scribe-lane alignment marks. Similarly, in situations in which more than one die is provided on the patterning device MA, the mask alignment marks M1, M2 may be located between the dies.

The depicted apparatus could be used in at least one of the following modes:

1. In step mode, the mask support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask support structure MT and the substrate table WT are scanned synchronously while a pattern imparted to the radiation beam is projected onto a target portion C (i.e. a single dynamic exposure). The velocity and direction of the substrate table relative to the mask support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.
3. In another mode, the mask support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
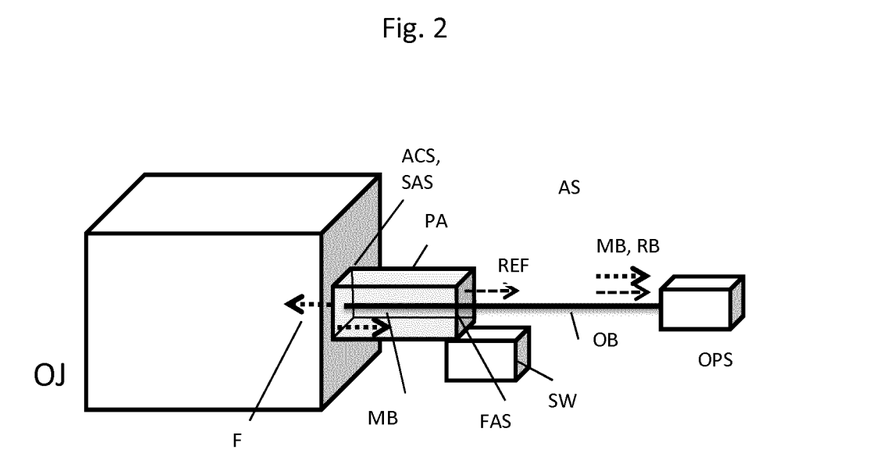
FIG. 2 depicts an actuator system according to an embodiment of the invention.

FIG. 2 depicts a schematic view of an actuator system AS according to an embodiment of the invention. The actuator system AS is connected to an object OJ in order to position the object OJ. The actuator system AS comprises a piezo actuator PA, i.e. a piezo electric actuator. An actuator contact surface ACS of the piezo actuator PA contacts the object OJ. Another side of the piezo actuator PA is connected to a reference, such as a steady structure SW. As a result, when applying a driving voltage onto the piezo actuator PA, the piezo electric effect will make the piezo actuator PA deform, hence exerting a force F onto the object OJ. The force F exerted on the object OJ may lead to deformation and/or positioning the object OJ. The piezo actuator PA comprises a transparent piezo material, i.e. a transparent piezo electric material. The actuator system AS further comprises an optical position sensor OPS. In the present example, the optical position sensor OPS is formed by an interferometer. Other examples, amongst which various types of interferometer as well as an encoder, will follow. In general, an optical parameter of the optical beam OB (interference, interaction with an encoder grating, displacement, etc.) is applied by the optical position sensor OPS to derive information about a position of the actuator contact surface ACS. The optical position sensor OPS directs an optical beam OB towards the transparent piezo material of the piezo actuator PA. Hence, the optical beam OB propagates through the transparent piezo material. The transparent piezo material may for example be Lithium Niobate, LiNBO3, having the additional benefit of a low hysteresis.

As a result of the optical position sensor OPS directing the optical beam OB through the transparent piezo material, a combination of an actuator with a sensor may be provided that is small. Furthermore, the actuator sensor combination may be accurate, as the optical beam OB immediately interacts with the actuator contact surface ACS, thereby enabling to directly measure a deformation of the piezo electric material of the actuator system AS. Transparency is to be understood as transparency for the optical wavelength used by the optical position sensor OPS, the wavelength of the optical beam OB. The transparency may be full or partial, for example, the transparency may be at least 50%.

Referring to the embodiment as depicted in FIG. 2, the optical position sensor OPS comprises an interferometer which directs a measurement beam MB and a reference beam RB to the piezo actuator PA. The measurement beam MB is part of the optical beam OB that propagates through the transparent piezo material of the piezo actuator PA. The reference beam RB is part of the optical beam OB that does not propagate through the transparent piezo material. Hence, a deformation of the transparent piezo material causes an optical path length of the measurement beam MB propagating through the transparent piezo material, to change. The interferometer may hence detect an interference between the reference beam RB and the measurement beam MB. In the embodiment as depicted in FIG. 2, the optical beam OB is incident on a first piezo electric material surface FAS of the piezo electric material. The first piezo electric material surface FAS faces away from the actuator contact surface ACS of the piezo actuator PA. A part of the optical beam OB reflects on the first piezo electric material surface FAS, thereby forming the reference beam RB. Another part of the optical beam OB propagates into the transparent piezo material, reflects on a second piezo electric material surface SAS, and propagates back along a same optical path. The second piezo electric material surface SAS may comprise the actuator contact surface ACS. An interference between the measurement beam MB and the reference beam RB is detected by an optical detector of the optical position sensor OPS. The configuration as described with reference to FIG. 2 may hence form a Fizeau configuration interferometer. Using a circulator to separate the reference beam RB and the measurement beam MB, an optical fiber may guide the reference beam RB and the measurement beam MB to the detector.

Figure 3:
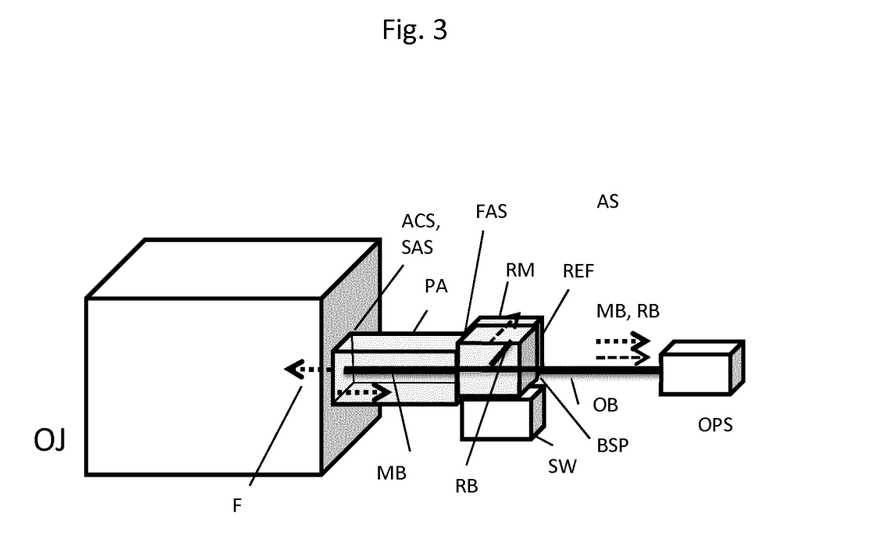
FIG. 3 depicts an actuator system according to another embodiment of the invention.

FIG. 3 depicts another embodiment wherein use is made of a Michelson type interferometer configuration. Deviating from the embodiment as described with reference to FIG. 2, a beam splitter BSP is provided at the first piezo electric material surface FAS. The beam splitter BSP splits the optical beam OB into the reference beam RB and the measurement beam MB. The measurement beam MB propagates through the transparent piezo material of the piezo actuator PA, reflects at the second piezo electric material surface SAS and returns along a same path. The second piezo electric material surface SAS may comprise the actuator contact surface ACS. The reference beam RB reflects at a reference mirror RM perpendicular to the first piezo electric material surface FAS. The first piezo electric material surface FAS forms a reference mirror in a reference path REF. The reflected measurement beam MB and the reflected reference beam RB propagate to a detector of the optical position sensor OPS, where interference is detected.

Figure 4:
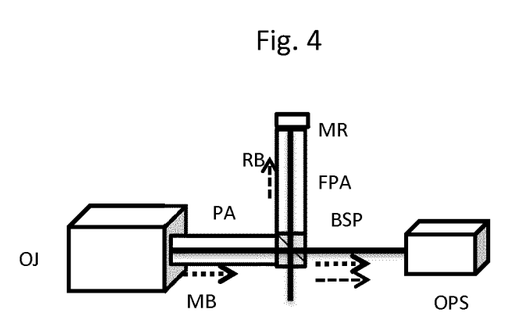
FIG. 4 depicts an actuator system according to yet another embodiment of the invention.
Figure 5:
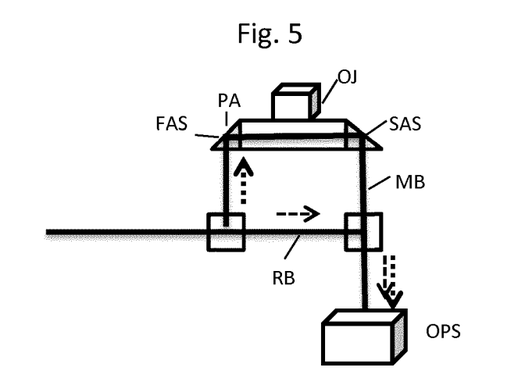
FIG. 5 depicts an actuator system according to a further embodiment of the invention.

FIG. 4 likewise depicts a Michelson type interferometer configuration. Additionally to the configuration as described with reference to FIG. 3, the configuration in accordance with FIG. 4 also applies a transparent piezo material in the reference path REF of the interferometer. A reference mirror RM of the reference path REF is connected to an end of the further transparent piezo material of a further piezo actuator FPA. Thereby, an optical path length of the reference path REF may be modulated by correspondingly driving the further piezo actuator FP in the reference path REF. Hence, using a suitable modulation frequency, a detection by the interferometer may be shifted to a higher frequency band, hence lowering a sensitivity to low frequency noise and disturbances. a FIG. 5 depicts another embodiment wherein use is made of a Mach Zehner type interferometer configuration. Deviating from the embodiments as described with reference to FIGS. 2 and 3, the piezo electric material extends from the first piezo electric material surface FAS to the second piezo electric material surface SAS that are oriented at an angle with respect of each other. For example, the angle is 90° or any other suitable value to direct the measurement beam MB to allow interference of the measurement beam MB and the reference beam RB with each other. The first piezo electric material surface FAS and the second piezo electric material surface SAS act as mirrors that reflect the measurement beam MB of the interferometer. At an angle of incidence of 45 degrees, the measurement beam MB is reflected by the first piezo electric material surface FAS. The second piezo electric material surface SAS subsequently reflects the measurement beam MB at an angle of 45 degree. In total, the measurement beam MB is reflected at an angle of 90 degrees with respect of the incoming beam. The measurement beam MB propagates through the transparent piezo material while the reference beam RB follows a reference path external of the transparent piezo material of piezo actuator PA.

Figure 6A:
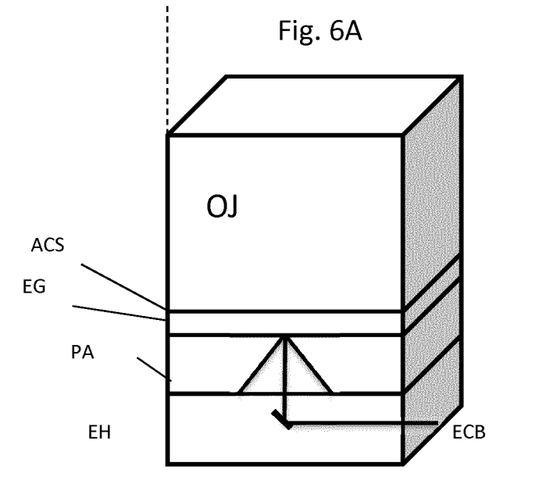
FIG. 6A-6C depict actuator systems according to still further embodiments of the invention.
Figure 6B:
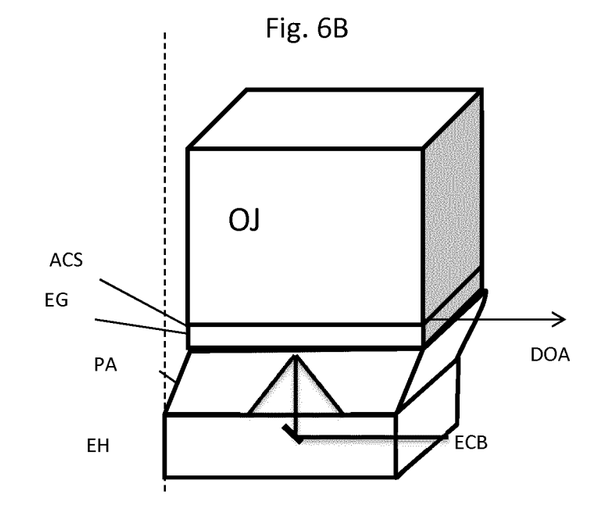

The above configurations provide examples wherein the optical position sensor OPS comprises an interferometer. Other configurations are possible, for example using an encoder. Accordingly, FIGS. 6A and 6B depict an embodiment wherein an object OJ that is to be positioned is connected to a stationary reference by means of a piezo actuator PA. The piezo actuator PA comprises a transparent piezo material. An encoder grating EG, such as a diffraction grating, is provided between the piezo actuator PA and the object OJ to be positioned. In the present example, the piezo actuator PA forms a sheer piezo, i.e. when actuated, the piezo actuator PA provides for a sheer deformation that moves the object OJ (seen in the plane of the drawing) from left to right or vice versa along a direction of actuation DOA. Due to the sheer effect of the piezo actuator PA, the encoder grating EG that is provided at the side of the piezo actuator PA facing the object OJ, will move likewise. A movement of the encoder grating EG (in respect of encoder head EH) may be detected by an encoder configuration, wherein an encoder beam ECB is transmitted through the transparent piezo material in a direction perpendicular to the encoder grating EG, i.e. perpendicular to the direction of movement of the object OJ. Thus, movement of the actuator contact surface ACS (at the encoder grating EG) can be accurately measured, as the actuator contact surface ACS and the encoder grating EG are highly integrated. The encoder may for example detect a zero order diffraction, a minus or plus first order diffraction, etc.

Figure 6C:
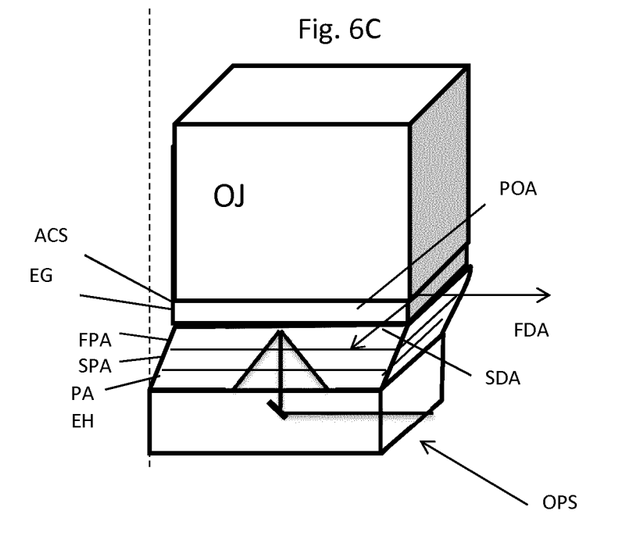

A sheer piezo acting in two directions may be formed. Thereto, the piezo actuator PA (such as the actuator depicted in FIG. 6C) may comprise a first sheer piezo actuator FPA which provides a sheer movement in a first direction of actuation FDA, and a second sheer piezo actuator SPA which provides a sheer movement in a second direction of actuation SDA. The first direction of actuation FDA and the second direction of actuation SDA are different from each other, for example substantially perpendicular to each other, and define a plane of actuation POA (extending substantially parallel to the encoder grating EG in FIGS. 6A and 6B). Referring to FIG. 6C, the first sheer piezo actuator FPA and second sheer piezo actuator SPA may for example form two piezo layers extending in the plane of actuation POA and placed on top of each other. The first sheer piezo actuator FPA and the second sheer piezo actuator SPA comprise the transparent piezo material. The optical position sensor OPS transmits the encoder beam ECB through the (stacked) first sheer piezo actuator FPA and the second sheer piezo actuator SPA. In order to provide a two dimensional position sensing, the encoder grating EG as depicted in FIG. 6C forms a 2 dimensional grating extending parallel to the plane of actuation POA. Hence, a compact 2 dimensional positioning may be provided.

A 3 dimensional actuator may be provided as follows: The optical position sensor OPS may further comprise an interferometer, such as the interferometers described with reference to FIGS. 2-5. The interferometer beam (e.g. the measurement beam MB of the interferometer) is directed perpendicular to the encoder grating EG and e.g. reflects at the encoder grating EG, thereby measuring the position of the actuator contact surface ACS in a direction perpendicular to the actuator contact surface ACS, resp. the encoder grating EG resp. the plane of actuation POA. The encoder head EH may also accommodate a sensor of the interferometer. Thus, in this embodiment the optical position sensor OPS comprises both an interferometer and an encoder. The actuator system AS may be formed by a stack of two sheer piezo actuator FPA, SPA and a piezo actuator PA. The two sheer piezo actuators FPA and SPA act in a direction perpendicular to each other and act parallel to the plane of the encoder grating EG. The piezo actuator PA acts in the direction perpendicular to the plane of the encoder grating EG, i.e. perpendicular to the plane of actuation POA of the sheer piezo actuators FPA, SPA. Hence, a compact 3 dimensional actuator with integrated 3 dimensional position measurement may be provided.

Figure 7:
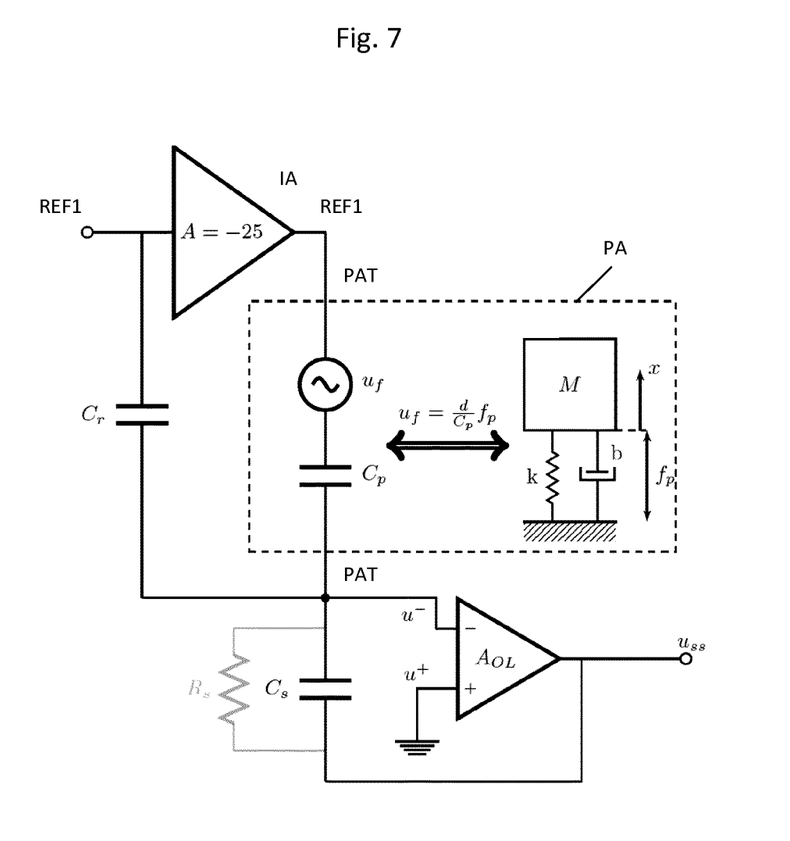
FIG. 7 depicts a circuit diagram of a sensing circuit according to an embodiment of the invention.

FIG. 7 depicts an electrical circuit diagram of a circuit that may be used to sense a mechanical force acting on the piezo actuator PA. Existing sensing circuits to sense a force rely on a hysteresis of the piezo material. As the transparent piezo material applied in the present concept may however be free from hysteresis or only exhibit a low amount of hysteresis, another means of sensing a force applied to the transparent piezo material has been devised, as follows:

An integrator circuit having a current input, i.e. a circuit that integrates input current, is formed by amplifier $A_{oL}$ and feedback capacitor $C_s$ connected between an output of the amplifier and the inverting input thereof. A non-inverting input of the amplifier is connected to ground, causing the inverting input to be kept at a voltage level at or near ground voltage. One terminal PAT of the piezo actuator is connected to the inverting input, i.e. the current input of the amplifier. The other terminal PAT of the piezo actuator PA is connected to a first reference REF1. An electric force applied to the piezo electric material translates into a voltage $u_f$ over the piezo electric element, in fact due to the piezo electric effect in the reverse direction, i.e. the direction from mechanical to electrical. The voltage $u_f$ is amplified by an inverting voltage amplifier circuit formed by the piezo actuator capacitance $C_p$ of the piezo element and the integrating amplifier. Hence, an alternating force applied to the piezo material may be read out. An actuation signal applied to the piezo electric actuator would likewise result in an output at $u_{ss}$, which could hence not be distinguished from the force signal. Thereto, the following extra circuit has been devised: a further capacitor $C_r$ is connected with one terminal to the input of the integrator formed by amplifier $A_{OL}$. The other terminal of the further capacitor is connected to an inverse of the signal applied to the piezo actuator PA, e.g. using inverting amplifier IA. In case the capacitance value of the further capacitor and the capacitance value of the piezo actuator are the same, the inverting amplifier could have a gain of −1. As a result, opposite currents due to the actuator drive signal and its inverse, would substantially cancel each other at the input of the integrator, causing an output signal $u_{ss}$ solely formed by the force signal Practically, the further capacitor value may be chosen larger than the piezo capacitance, e.g. by a factor N, which may be taken into account by providing an amplification factor of the inverting amplifier at a factor −N.

The actuator system AS as described in the present document may be applied in a lithographic apparatus. For example, the actuator system AS may be applied in a pusher that pushes the patterning device (also referred to as "reticle pusher"). The pusher exerts a force onto the patterning device MA so as to at least partly counteract deformation of the patterning device MA during accelerations of the mask support structure MT that holds the patterning device MA. Due to configuration as presented in the present document, a compact and lightweight construction may be provided that adds relatively low weight to the moving mask support structure MT, while enabling high accuracy actuation. In another embodiment, the actuator system AS may be applied in pins provided on the substrate stage (i.e. the wafer table WT), which pins carry the substrate W. The pins may be referred to as "e-pins" or "extraction pins". When the substrate W is to be loaded on un-loaded, the pins extend upward, allowing a gripper to handle the substrate W. When holding the substrate W, the pins may move downwardly. Similarly to the reticle pusher, due to the configuration as presented in the present document, a compact and lightweight construction may be provided that adds relatively low weight to the moving substrate table WT, while enabling high accuracy actuation. Apart from the reticle "pusher" (e.g. used during acceleration of the reticle), an application could be a "reticle shifter", allowing nanometer scale positioning of the reticle on the mass support structure MT. The reticle shifter may reduce a positioning error during a scan, e.g. by compensating wafer (substrate) stage errors. The actuator system AS as described above may further be used to control the position of an optical element, such as an optical element in the projection system PS. The optical element may comprise a mirror or a lens.

In an embodiment, there is provided an actuator system configured to position an object, the actuator system comprising: a piezo actuator comprising an actuator contact surface, wherein the piezo actuator is configured to exert a force via the actuator contact surface onto the object, and an optical position sensor configured to measure a position of the actuator contact surface, wherein the piezo actuator comprises a transparent piezo material, wherein the optical position sensor is configured to transmit an optical beam through the transparent piezo material to the actuator contact surface.

In an embodiment, the transparent piezo material is $LiNBO_3$. In an embodiment, a direction of transmission of the optical beam through the transparent piezo electric material corresponds to a direction of actuation of the piezo actuator. In an embodiment, the optical position sensor comprises an interferometer arranged to provide a measurement beam and a reference beam, wherein the optical beam comprises the measurement beam. In an embodiment, the transparent piezo material extends in a direction of actuation of the piezo actuator from a first piezo electric material surface to a second piezo electric material surface, wherein the optical position sensor is configured to reflect the reference beam on the first piezo electric material surface, wherein the optical position sensor is configured to propagate the measurement beam from the first piezo electric material surface through the transparent piezo material to the second piezo electric material surface, and wherein the optical position sensor is configured to reflect the measurement beam at the second piezo electric material surface back to the first piezo electric material surface. In an embodiment, the actuator comprises a beam splitter, wherein the transparent piezo material extends in a direction of actuation of the piezo actuator from a first piezo electric material surface to a second piezo electric material surface, wherein the first piezo electric material surface is arranged facing the beam splitter, wherein the optical position sensor is configured to transmit the measurement beam from the beam splitter via the first piezo electric material surface through the transparent piezo material and to reflect the measurement beam at the second piezo electric material surface. In an embodiment, the transparent piezo material extends in a direction of actuation of the piezo actuator from a first piezo electric material surface to a second piezo electric material surface, wherein the first piezo electric material surface and the second piezo electric material surface are oriented at an angle with respect to each other and each is arranged to reflect the measurement beam while the measurement beam propagates through the transparent piezo material. In an embodiment, the second piezo electric material surface comprises the actuator contact surface. In an embodiment, the actuator system further comprises a second piezo actuator comprising the transparent piezoelectric material, wherein the reference beam extends through the transparent piezoelectric material of the second piezo actuator, wherein the second piezo actuator is comprised in a modulator configured to modulate the reference beam. In an embodiment, the piezo actuator comprises a sheer piezo and wherein the optical position sensor comprises an encoder grating, wherein the optical position sensor is configured to transmit the optical beam through the piezo actuator onto the encoder grating. In an embodiment, the piezo actuator comprises a first sheer piezo actuator configured to provide a sheer movement in a first direction of actuation, and a second sheer piezo actuator configured to provide a sheer movement in a second direction of actuation different from the first direction of actuation, wherein the first direction of actuation and the second direction of actuation define a plane of actuation, wherein the first piezo actuator and the second sheer piezo actuator each comprise the transparent piezo material, wherein the optical position sensor is configured to transmit the optical beam through the first piezo actuator and the second sheer piezo actuator, and wherein the encoder grating comprises a two dimensional grating extending parallel to the plane of actuation. In an embodiment, the optical position sensor is configured to measure the position of the actuator contact surface in the first direction of actuation, in the second direction of actuation and in a direction perpendicular to the plane of actuation. In an embodiment, the actuator system further comprises a measurement circuit to measure a force acting on the piezo actuator, the measurement circuit comprising: an integrator circuit having a current input configured to integrate a current flowing into the current input, one electrical terminal of the piezo actuator being connected to the current input, the other electrical terminal of the piezo actuator being connected to a reference signal.

In an embodiment, there is provided a lithographic apparatus comprising the actuator system as described herein. In an embodiment, the actuator system is comprised in at least one selected from: a patterning device pusher, a patterning device shifter, an e-pin and/or a position control actuator of an optical element of the lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An actuator system configured to position an object, the actuator system comprising:
    a piezo actuator comprising an actuator contact surface, wherein the piezo actuator is configured to exert a force via the actuator contact surface onto the object and the piezo actuator comprises a transparent piezo material;
    an optical position sensor configured to measure a position of the actuator contact surface,
    wherein the optical position sensor is configured to transmit an optical beam through the transparent piezo material to the actuator contact surface.

2. The actuator system according to claim 1, wherein the transparent piezo material is $LiNBO_3$.

3. The actuator system according to claim 1, wherein a direction of transmission of the optical beam through the transparent piezo material corresponds to a direction of actuation of the piezo actuator.

4. The actuator system according to claim 1, wherein the optical position sensor comprises an interferometer arranged to provide a measurement beam and a reference beam, wherein the optical beam comprises the measurement beam.

5. The actuator system according to claim 4, wherein the transparent piezo material extends in a direction of actuation of the piezo actuator from a first piezo electric material surface to a second piezo electric material surface,
    wherein the optical position sensor is configured to reflect the reference beam on the first piezo electric material surface, and
    wherein the optical position sensor is configured to propagate the measurement beam from the first piezo electric material surface through the transparent piezo material to the second piezo electric material surface, and
    wherein the optical position sensor is configured to reflect the measurement beam at the second piezo electric material surface back to the first piezo electric material surface.

6. The actuator system according to claim 5, wherein the second piezo electric material surface comprises the actuator contact surface.

7. The actuator system according to claim 4, further comprising a beam splitter,
    wherein the transparent piezo material extends in a direction of actuation of the piezo actuator from a first piezo electric material surface to a second piezo electric material surface,
    wherein the first piezo electric material surface is arranged facing the beam splitter,
    wherein the optical position sensor is configured to transmit the measurement beam from the beam splitter via the first piezo electric material surface through the transparent piezo material and to reflect the measurement beam at the second piezo electric material surface.

8. The actuator system according to claim 4, wherein the transparent piezo material extends in a direction of actuation of the piezo actuator from a first piezo electric material surface to a second piezo electric material surface, and
    wherein the first piezo electric material surface and the second piezo electric material surface are oriented at an angle with respect to each other and each is arranged to reflect the measurement beam while the measurement beam propagates through the transparent piezo material.

9. The actuator system according to claim 4, further comprising a second piezo actuator comprising transparent piezoelectric material, wherein the reference beam extends through the transparent piezoelectric material of the second piezo actuator, and wherein the second piezo actuator is comprised in a modulator configured to modulate the reference beam.

10. The actuator system according to claim 1, wherein the piezo actuator comprises a shear piezo, wherein the optical position sensor comprises an encoder grating, and wherein the optical position sensor is configured to transmit the optical beam through the piezo actuator onto the encoder grating.

11. The actuator system according to claim 10, wherein the piezo actuator comprises a first shear piezo actuator configured to provide a shear movement in a first direction of actuation, and a second shear piezo actuator configured to provide a shear movement in a second direction of actuation different from the first direction of actuation, wherein the first direction of actuation and the second direction of actuation define a plane of actuation, wherein the first shear piezo actuator and the second shear piezo actuator each comprise the transparent piezo material, wherein the optical position sensor is configured to transmit the optical beam through the first shear piezo actuator and the second shear piezo actuator, and wherein the encoder grating comprises a two dimensional grating extending parallel to the plane of actuation.

12. The actuator system according to claim 10, wherein the optical position sensor is configured to measure the position of the actuator contact surface in a first direction of actuation, in a second direction of actuation and in a direction perpendicular to a plane of actuation.

13. The actuator system according to claim 1, further comprising a measurement circuit to measure a force acting on the piezo actuator, the measurement circuit comprising:

an integrator circuit having a current input and configured to integrate a current flowing into the current input, one electrical terminal of the piezo actuator being connected to the current input, and another electrical terminal of the piezo actuator being connected to a reference signal.

14. A lithographic apparatus comprising the actuator system according to claim 1.

15. The lithographic apparatus according to claim 14, wherein the actuator system is comprised in at least one selected from: a patterning device pusher, a patterning device shifter, an e-pin and/or a position control actuator of an optical element of the lithographic apparatus.

16. A method comprising:

exerting a force via an actuator contact surface onto an object, wherein a piezo actuator comprises the actuator contact surface and the piezo actuator comprises a transparent piezo material; and measuring a position of the actuator contact surface by transmitting an optical beam through the transparent piezo material to the actuator contact surface.

17. The method according to claim 16, wherein a direction of transmission of the optical beam through the transparent piezo material corresponds to a direction of actuation of the piezo actuator.

18. The method according to claim 16, wherein the measuring comprises using an interferometric technique involving a measurement beam and a reference beam, wherein the optical beam comprises the measurement beam.

19. The method according to claim 16, wherein the actuator contact surface is in at least one selected from: a patterning device pusher of a lithographic apparatus, a patterning device shifter of a lithographic apparatus, an e-pin of a lithographic apparatus and/or a position control actuator of an optical element of the lithographic apparatus.

20. The method according to claim 16, wherein the piezo actuator comprises a shear piezo, wherein the measuring involves using an encoder grating, and wherein the measuring comprises transmitting the optical beam through the piezo actuator onto the encoder grating.

* * * * *